US006716667B2

(12) United States Patent
Yamaguchi

(10) Patent No.: US 6,716,667 B2
(45) Date of Patent: Apr. 6, 2004

(54) SEMICONDUCTOR DEVICE MANUFACTURING METHOD, MAKING NEGATIVE PRESSURE FOR FIXING A CHIP ON A SUBSTRATE

(75) Inventor: Yasuo Yamaguchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/131,480

(22) Filed: Apr. 25, 2002

(65) Prior Publication Data

US 2003/0042584 A1 Mar. 6, 2003

(30) Foreign Application Priority Data

Sep. 5, 2001 (JP) .......................... 2001-268665

(51) Int. Cl.⁷ ............................... H01L 21/50
(52) U.S. Cl. ................ 438/106; 438/121; 438/123; 438/125; 257/666; 257/678; 257/782
(58) Field of Search ................. 438/106, 121, 438/123, 125, 115; 257/666, 678–733, 782, 676

(56) References Cited

U.S. PATENT DOCUMENTS 5,998,242 A * 12/1999 Kirkpatrick et al. ......... 438/127
6,350,630 B1 * 2/2002 Wildgen ...................... 438/51
6,358,776 B1 * 3/2002 Takehara et al. ............ 438/113

FOREIGN PATENT DOCUMENTS

| JP | 64-80031 | 3/1989 |
| JP | 2-37729 | 2/1990 |
| JP | 2000-138255 | 5/2000 |
| JP | 2000-252396 | 9/2000 |

* cited by examiner

*Primary Examiner*—David Nelms
*Assistant Examiner*—Long Tran
(74) *Attorney, Agent, or Firm*—McDermott, Will & Emery

(57) ABSTRACT

A semiconductor chip is fixed on the main surface of a semiconductor substrate by establishing negative pressure compared to a atmospheric pressure, in a space between the chip and substrate.

6 Claims, 8 Drawing Sheets

SEMICONDUCTOR DEVICE MANUFACTURING METHOD, MAKING NEGATIVE PRESSURE FOR FIXING A CHIP ON A SUBSTRATE

BACKGROUND OF THE INVENTION

1. Field of the Invention

The present invention relates to a semiconductor device and a method of manufacturing the same, and more specifically to a structure of a semiconductor device having a semiconductor chip fixed on a lead frame, and a method of manufacturing the same.

2. Description of the Background Art

FIG. 11 is a perspective view schematically showing a semiconductor chip to be fixed on a lead frame in a method of manufacturing a conventional semiconductor device. Referring to FIG. 11, conventionally, a semiconductor chip 105 is fixed using a die bonding material 102 on an island portion 101a of a lead frame 101, which has island portion 101a and a lead portion 101b.

A cross section of a semiconductor device thus manufactured has a structure shown in FIG. 12, after resin sealing. Referring to FIG. 12, semiconductor chip 105 is fixed on island portion 101a by means of die bonding material 102. The bonding pad (not shown) of this semiconductor chip 105 is electrically connected with lead portion 101b using a bonding wire 106. Island portion 101a, die bonding material 102, semiconductor chip 105 and bonding wire 106 are sealed with mold resin 107. Only a plurality of lead portions 101b protrude from mold resin 107 for electrical connection with the outside.

As described above, die bonding material 102 is conventionally used to fix semiconductor chip 105 on lead frame 101. Solder material or adhesive is usually used as die bonding material 102. Usually, solder consisting of Pb (lead)-Sn (tin) alloy is used for this solder material, and lead is thus contained.

Lead intake may cause nerve disorder or disturbance of reproduction system. Moreover, lead may cause anemia or hypertension and is suspected of being a carcinogenic metal. Therefore, if electronic equipment products including solder are disposed of, lead contained in solder may melt into and contaminate soil or underground water to adversely affect human bodies, thus resulting in an environmental problem.

SUMMARY OF THE INVENTION

An object of the present invention is to provide a semiconductor device in which a semiconductor chip can be fixed on a lead frame without using a die bonding material, and a method of manufacturing the same. As a result, it becomes possible to provide a semiconductor device capable in which a semiconductor chip can be fixed on a lead frame without using lead (that is, lead-free), and a method of manufacturing the same.

A semiconductor device in accordance with the present invention includes a semiconductor substrate having a main surface, and a semiconductor chip arranged on the main surface of the substrate, wherein a space kept airtight is provided between the main surface of the substrate and the semiconductor chip, and the semiconductor chip is supported on the substrate by making negative the atmospheric pressure in the space relative to the atmospheric pressure outside the semiconductor device.

In the semiconductor device according to the present invention, the semiconductor chip is fixed on the substrate by making negative the atmospheric pressure in the space between the substrate and the semiconductor chip relative to the atmospheric pressure outside the semiconductor device. Accordingly, the semiconductor chip can be fixed on the substrate even without using a die bonding material. This can eliminate the problem of lead contained in solder that is commonly used as a die bonding material.

Preferably, the above-described semiconductor device further includes a seal member arranged between the substrate and the semiconductor chip in order to keep the space airtight.

The space between the semiconductor chip and the substrate can be kept airtight by using the seal member in this way.

In the above-described semiconductor device, it is preferable that a groove for fitting-in the seal member is formed on the main surface of the substrate.

Therefore, it is possible to fit and fix the seal member in the groove.

In the above-described semiconductor device, it is preferable that the substrate is directly in contact with the semiconductor chip, and at least that part of the substrate which is in contact with the semiconductor chip has a mirror surface.

Since that surface of the substrate which is in contact with the semiconductor chip has a mirror surface, the contact parts of the semiconductor chip and the substrate can be tightly connected and the space therebetween can be kept airtight.

In the above-described semiconductor device, it is preferable that a depressed portion to form a part of the space is formed on the main surface of the substrate.

Therefore, the space can easily be formed between the semiconductor chip and the substrate.

A method of manufacturing a semiconductor device according to the present invention includes the following steps.

The semiconductor chip is laid on the substrate in such a temperature environment that is higher than a temperature at a resin sealing step, such that a space kept airtight is created between the substrate and the semiconductor chip. After the semiconductor chip is laid on the substrate, the atmospheric pressure in the space is made negative relative to the external atmospheric pressure by lowering an ambient temperature, so that the semiconductor chip is fixed on the substrate.

In the method of manufacturing the semiconductor device according to the present invention, the semiconductor chip is fixed on the substrate by making negative the atmospheric pressure in the space between the substrate and the semiconductor chip relative to the atmospheric pressure outside the semiconductor device. Therefore, the semiconductor chip can be fixed on the substrate without using a die bonding material. This can eliminate the problem of lead contained in solder commonly used as a die-bonding material.

Furthermore, since the semiconductor chip is fixed on the substrate in such a temperature environment that is higher than a temperature at a resin sealing step, the atmospheric pressure in the space between the semiconductor chip and the substrate can remain negative relative to the external atmospheric pressure, even when heated at a highest temperature at the resin sealing step after the semiconductor chip being laid on the substrate. Therefore, the semiconductor chip remains fixed on the substrate even at the resin sealing step.

In the method of manufacturing the above-described semiconductor device, it is preferable that the step of laying the semiconductor chip on the substrate and the step of supporting the semiconductor chip on the substrate with lowered ambient temperature are performed in a one atmospheric pressure (1 atm) environment.

Accordingly, even in a high temperature environment when the semiconductor chip is laid on the substrate, the pressure in the airtight space can be 1 atm. Therefore, with the subsequent temperature drop, the atmospheric pressure in the airtight space can be decreased to be lower than 1 atm, that is, negative relative to the external atmospheric pressure (1 atm).

In the method of manufacturing the above-described semiconductor device, it is preferable that the 1 atm pressure environment is obtained in a high-temperature chamber of a structure having a portion open to the outside, so that the pressure inside thereof is always kept at 1 atm.

Thus, the 1 atm pressure environment can be created in a high-temperature chamber of a simple structure.

In the method of manufacturing the above-described semiconductor device, it is preferable that the 1 atm pressure environment is obtained in a high-temperature chamber of such a structure that allows variation in its capacity to maintain internal pressure at 1 atm.

Thus, the 1 atm pressure environment can be created in a high-temperature chamber of a simple structure.

In the method of manufacturing the above-described semiconductor device, it is preferable that the step of laying the semiconductor chip on the substrate and the step of fixing the semiconductor chip on the substrate with lowered ambient temperature are performed in a nitrogen gas atmosphere.

This can prevent an adverse effect such as oxidation of the semiconductor chip, the substrate and the seal member.

In the method of manufacturing the above-described semiconductor device, it is preferable that the step of laying the semiconductor chip on the substrate and the step of fixing the semiconductor chip on the substrate with lowered ambient temperature are performed in an inert gas atmosphere.

This can prevent an adverse effect such as oxidation of the semiconductor chip, the substrate and the seal member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures.

First Embodiment

Figure 1:
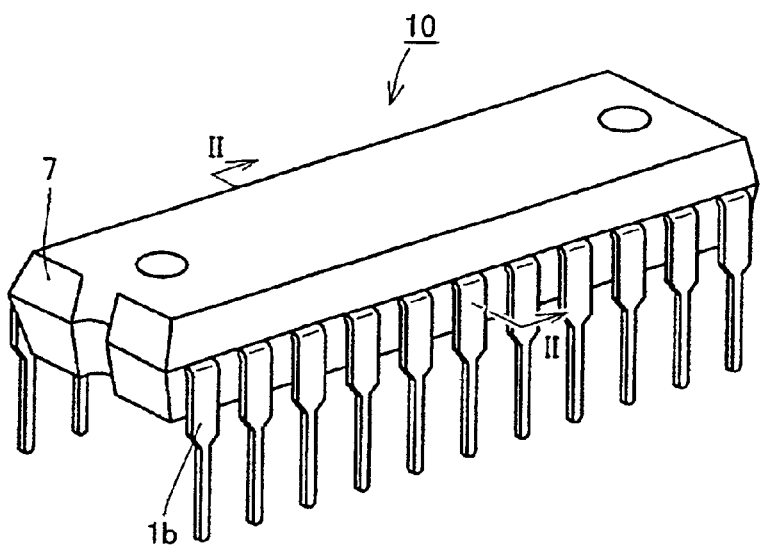
FIG. 1 is a perspective view schematically showing a configuration of a semiconductor device in accordance with a first embodiment of the present invention.
Figure 2:
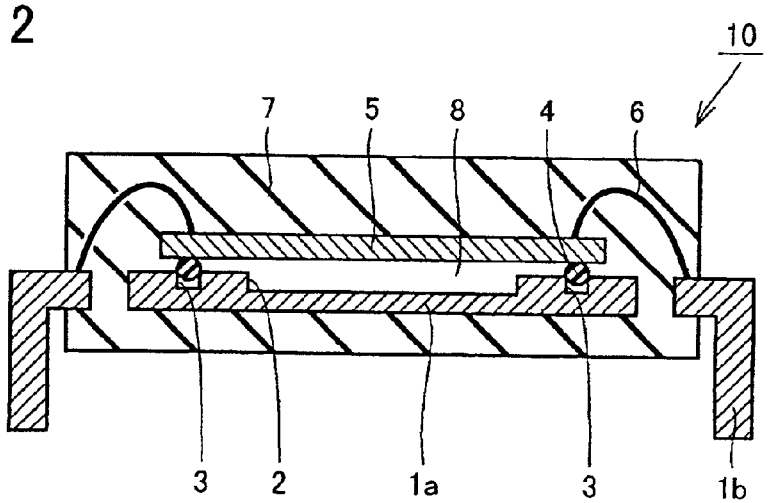
FIG. 2 is a schematic cross-sectional view taken along line II—II in FIG. 1.

Referring to FIGS. 1 and 2, a semiconductor package 10 mainly has an island portion 1a, a lead portion 1b, a seal member 4, a semiconductor chip 5, a bonding wire 6, and a mold resin 7.

A depressed portion 2 is provided on the main surface of island portion 1a, and a groove 3 is provided to surround the periphery of depressed portion 2. Seal member 4 is fitted in this groove 3, and semiconductor chip 5 is fixed on the main surface of island portion 1a with seal member 4 interposed. It is noted that seal member 4 is made of a material, such as indium or resin.

A bonding pad (not shown) is provided on the surface of semiconductor chip 5, and this bonding pad is electrically connected with lead portion 1b by means of a bonding wire 6. Island portion 1a, seal member 4, semiconductor chip 5, and bonding wire 6 are sealed with mold resin 7, and only a plurality of lead portions 1b protrude outside mold resin 7 for an electrical connection with the outside.

There exists a space 8 kept airtight by seal member 4, between island portion 1a and semiconductor chip 5. The atmospheric pressure inside this space 8 is lower than the atmospheric pressure outside semiconductor package 10 (1 atm), that is, a negative pressure. This negative pressure has to be set to such a degree that semiconductor chip 5 is sucked and fixed on island portion 1a so that semiconductor chip 5 is not detached from island portion 1a at a wire bonding step or at a resin sealing step in manufacturing the semiconductor package 10.

A method of manufacturing the semiconductor device of the present embodiment will now be described.

Figure 3:
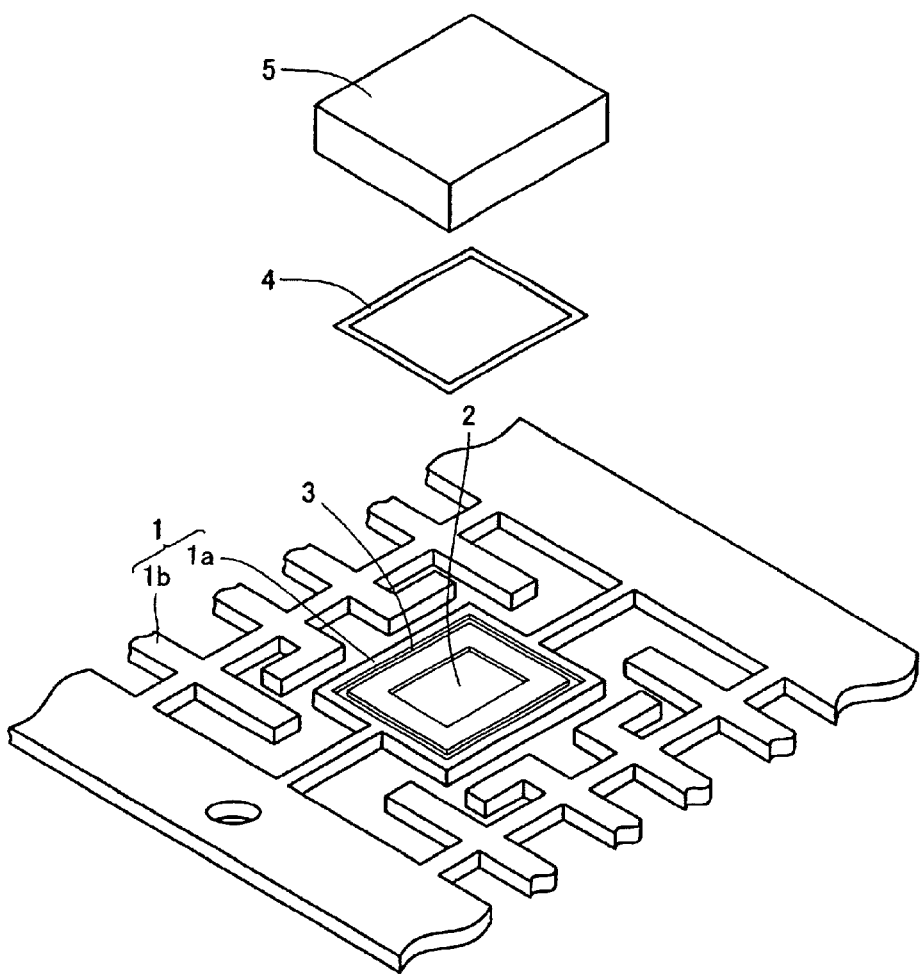
FIGS. 3–5 are schematic perspective views showing in order the steps of manufacturing the semiconductor device in accordance with the first embodiment of the present invention.

Referring to FIG. 3, a lead frame 1 having island portion 1a and lead portion 1b, seal member 4 and semiconductor chip 5 are first prepared. Depressed portion 2 is provided at the center part of the main surface of island portion 1a of lead frame 1, and groove 3 is provided to surround the periphery of this depressed portion 2.

Seal member 4 is fitted in this groove 3. Then, semiconductor chip 5 is laid on lead frame 1 in an environment of a high temperature and 1 atm. A high temperature as used herein refers to a temperature higher than a temperature at the step of sealing semiconductor chip 5 and lead frame 1 with resin (normally about 175° C.). Semiconductor chip 5 is laid on lead frame 1 such that the semiconductor chip 5 is arranged to be in contact with seal member 4. Thus, between lead frame 1 and semiconductor chip 5, a space that is kept airtight by the seal member 4 is formed.

Thereafter, by lowering the ambient temperature with the ambient atmosphere maintained at 1 atm, the atmospheric pressure in the airtight space becomes negative relative to the external atmospheric pressure (1 atm). This is based on the equation of state for ideal gas PV=nRT (P: pressure, V: volume, n: the number of moles, R: gas constant, T: absolute temperature). Specifically, since temperature T is decreased with volume V being constant in an airtight space when the ambient temperature drops, atmospheric pressure P in the airtight space is reduced to be lower than 1 atm according to the equation of state above, and thus becomes negative relative to the external atmospheric pressure. Therefore, semiconductor chip 5 is sucked and fixed on lead frame 1 because of the negative pressure in the airtight space.

Figure 4:
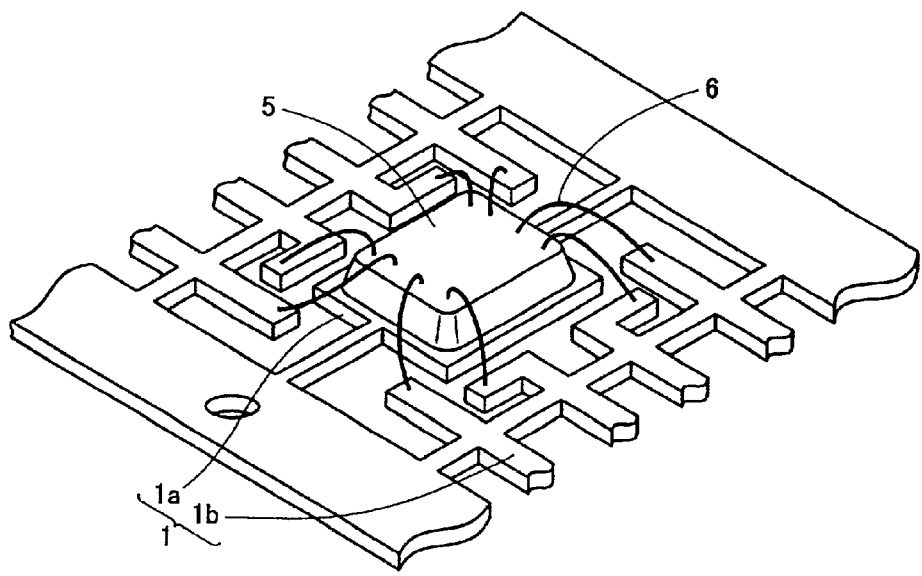

Referring to FIG. 4, wire bonding is performed, and the bonding pad of semiconductor chip 5 and lead portion 1b are electrically connected by means of bonding wire 6.

Figure 5:
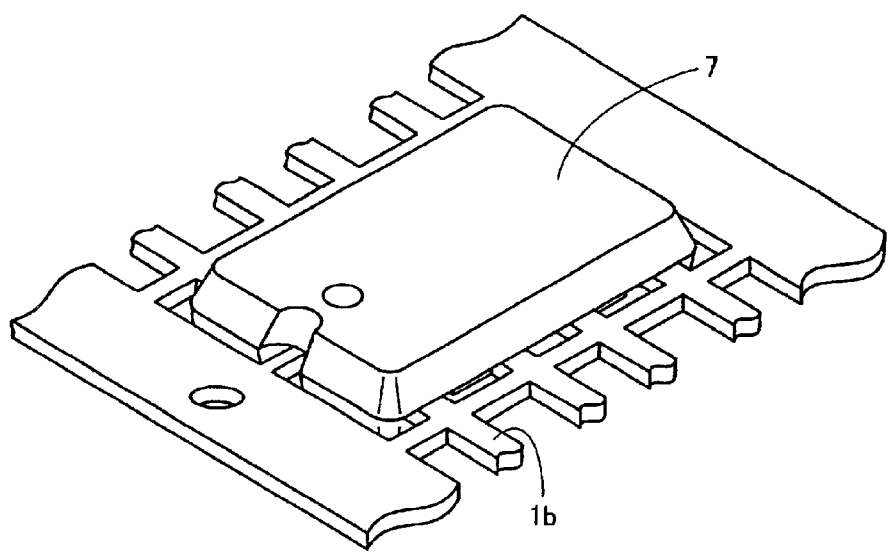

Referring to FIG. 5, island portion 1a, semiconductor chip 5, bonding wire 6 and the like are sealed with mold resin 7. Thereafter, through outer package plating, lead forming and marking etc., semiconductor package 10 shown in FIGS. 1 and 2 is completed.

In accordance with the present embodiment, semiconductor chip 5 is sucked and fixed on island portion 1a as the atmospheric pressure in the airtight space 8 becomes negative relative to the atmospheric pressure outside semiconductor package 10. Therefore, semiconductor chip 5 can be fixed on island portion 1a even without using a die bonding material such as solder, so that environmental problems due to lead in solder are avoided.

Figure 6:
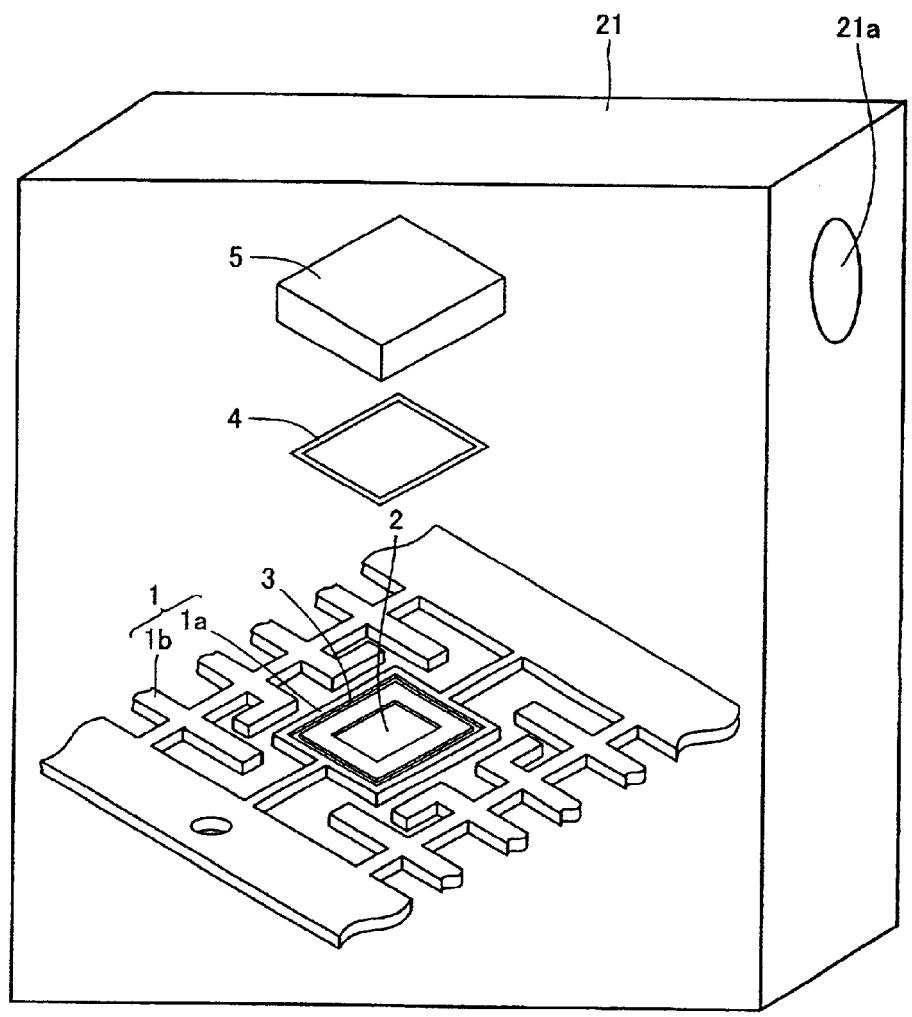
FIG. 6 is a schematic perspective view showing a configuration of a high-temperature chamber having a portion open to the outside.

It is noted that the step of laying semiconductor chip 5 on lead frame 1 and the step of lowering the ambient temperature after the laying step are performed in a high-temperature chamber 21 as shown in FIG. 6. This high-temperature chamber 21 has a portion 21a open to the outside of high-temperature chamber 21, and is structured such that open portion 21a can maintain 1 atm in high-temperature chamber 21.

Accordingly, semiconductor chip 5 can be laid on island portion 1a at 1 atm, even in a high temperature environment in high-temperature chamber 21. Therefore, the atmospheric pressure in the airtight space immediately after laying can be 1 atm. Then, with the subsequent lowered ambient temperature, the atmospheric pressure in the airtight space can be made lower than 1 atm and thus negative relative to the external atmospheric pressure (1 atm ).

Figure 7:
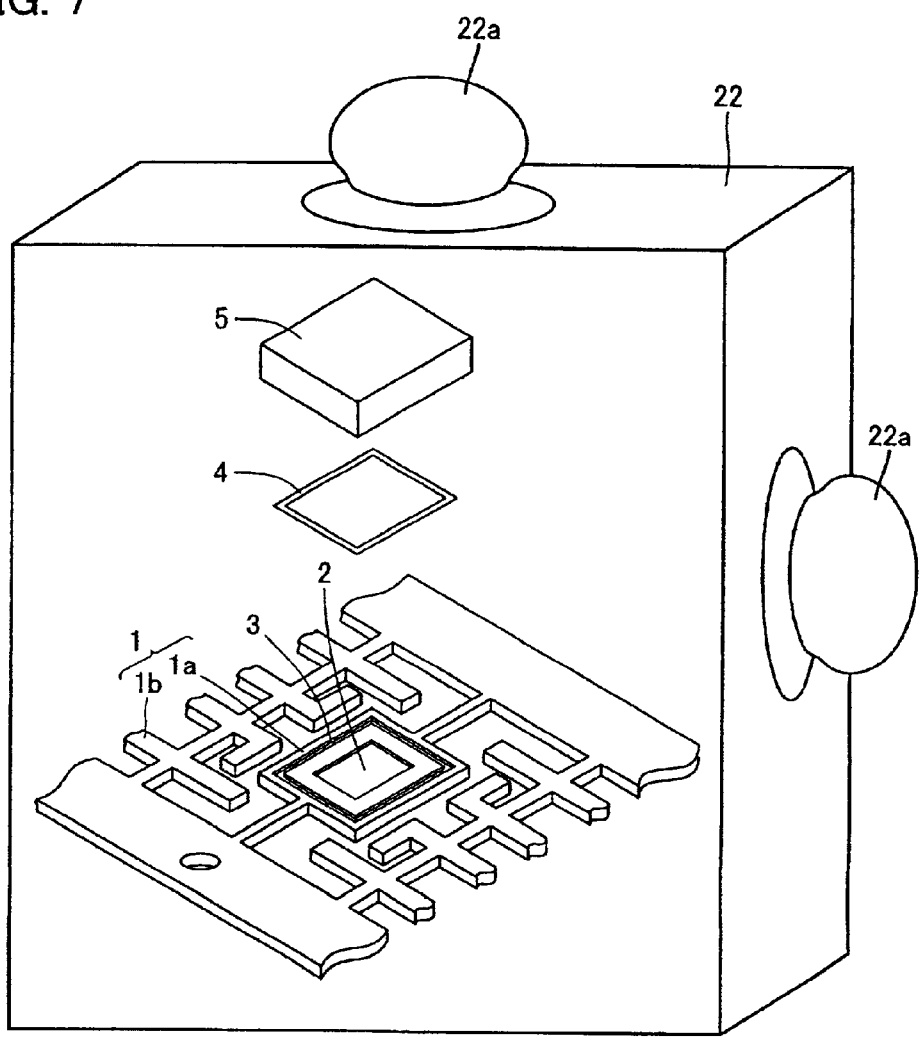
FIG. 7 is a schematic perspective view showing a configuration of the high-temperature chamber having such a structure that allows variation in the capacity of the high-temperature chamber by the atmospheric pressure in the high-temperature chamber.

Furthermore, as shown in FIG. 7, high-temperature chamber 22 may have a portion 22a that allows variation in the capacity of high-temperature chamber 22 to maintain 1 atm in high-temperature chamber 22. Thin rubber or the like, which can be inflated/deflated by the atmospheric pressure in high-temperature chamber 22, for example, may be used for this portion 22a of variable capacity. Alternatively, one which inflates like a bellows or a valve which can open and close according to the atmospheric pressure in high-temperature chamber 22 may be used for portion 22a of variable capacity.

Second Embodiment

In the manufacturing method according to the first embodiment above, the semiconductor device is preferably manufactured in a nitrogen gas atmosphere in high-temperature chamber 21 or 22. It is noted that the structure and manufacturing method of the semiconductor device is the same with the first embodiment expect this point, and therefore the description thereof will not be repeated.

In the present embodiment, since nitrogen gas is used as the atmosphere in high-temperature chamber 21 or 22, any adverse effect, such as oxidation, on lead frame 1, seal member 4, semiconductor chip 5 and the like can be prevented.

Third Embodiment

In the manufacturing method according to the first embodiment above, the semiconductor device is preferably manufactured in an inert gas atmosphere in high-temperature 21 or 22. It is noted that the structure and manufacturing method of the semiconductor device is the same with the first embodiment except this point, and therefore the description thereof will not be repeated.

In the present embodiment, since an inert gas is used as the atmosphere in high-temperature chamber 21 or 22, any adverse effect, such as oxidation, on lead frame 1, seal member 4, semiconductor chip 5 and the like can be prevented.

In the first to third embodiments above, though the semiconductor package having a cross sectional structure such as shown in FIG. 2 has been described, the configuration of the semiconductor device of the present invention is not limited thereto. The present invention is applicable to any configuration that has airtight space 8 at a negative pressure between island portion 1a and semiconductor chip 5. The configuration of the semiconductor device according to the present invention may have such a structure, for example, as shown in FIGS. 8–10.

Figure 8:
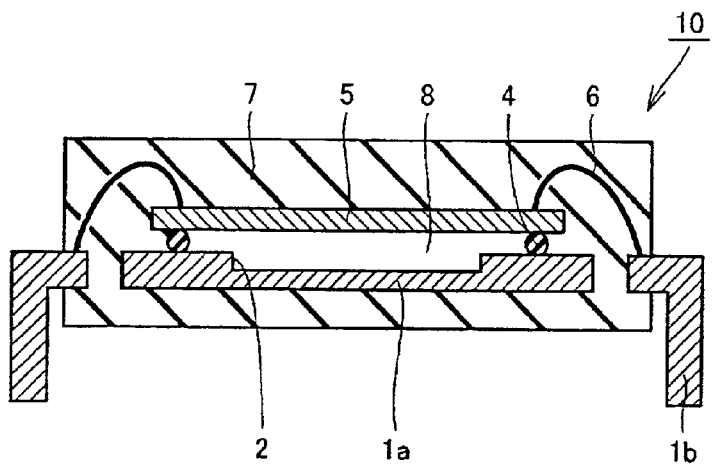
FIG. 8 is a schematic cross-sectional view showing a first modification of the semiconductor device of the present invention.

The configuration of the semiconductor device shown in FIG. 8 differs from that of FIG. 2 in that it does not have a groove for fitting-in seal member 4.

Figure 9:
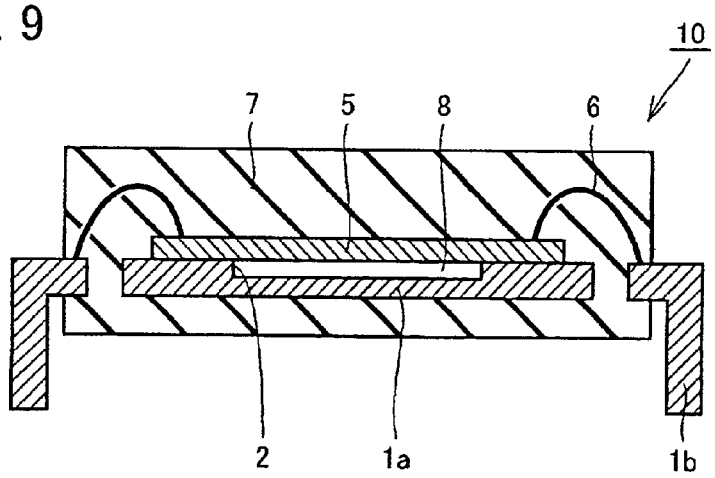
FIG. 9 is a schematic cross-sectional view showing a second modification of the semiconductor device of the present invention.

The configuration of the semiconductor device shown in FIG. 9 differs from that of FIG. 2 in that it does not have a groove and that island portion 1a is directly in contact with semiconductor chip 5. Here, airtight space 8 at a negative pressure is formed with a depressed portion provided at the center part of island portion 1a. Furthermore, since that part of island portion 1a which is in contact with semiconductor chip 5 has a mirror surface, island portion 1a and semiconductor chip 5 are tightly connected so that the space 8 can be kept airtight from the outside.

Figure 10:
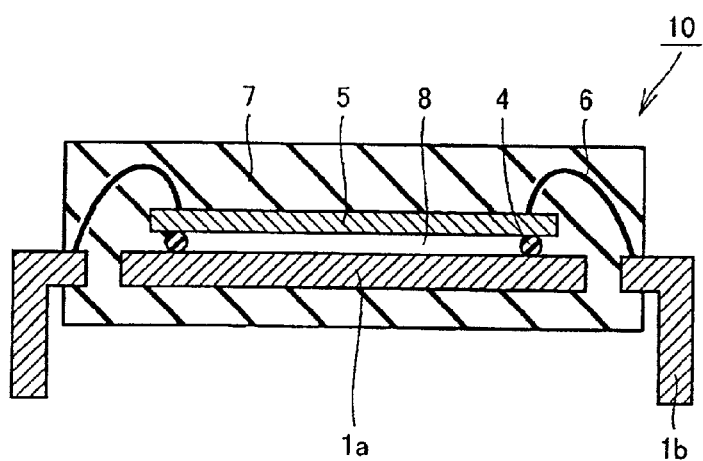
FIG. 10 is a schematic cross-sectional view showing a third modification of the semiconductor device of the present invention.
Figure 11:
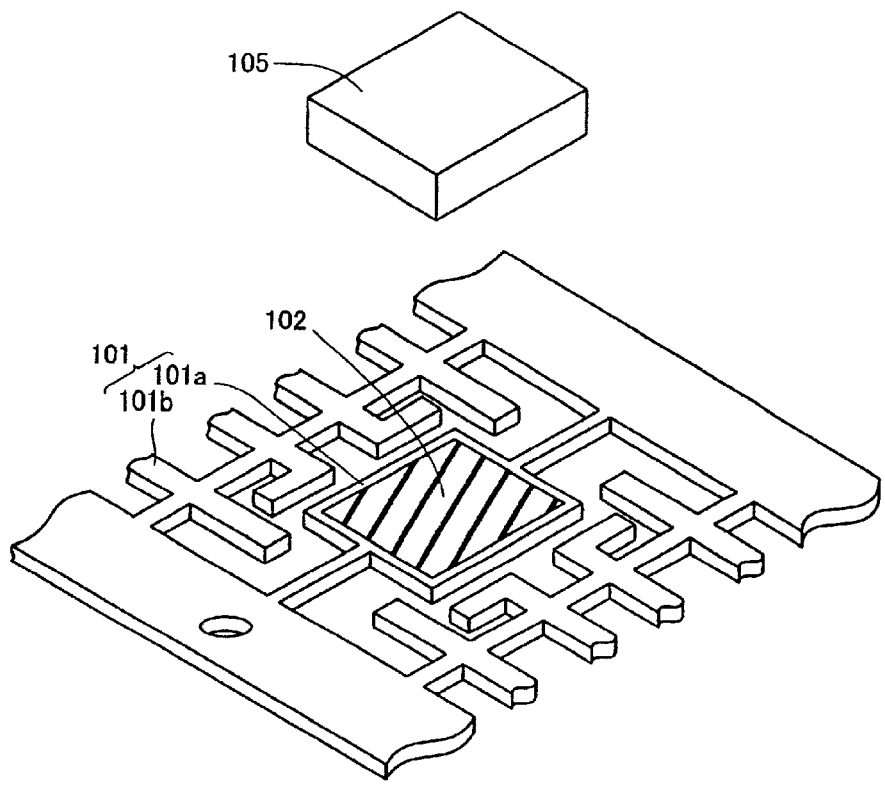
FIG. 11 is a schematic perspective view illustrating a method of manufacturing a conventional semiconductor device.
Figure 12:
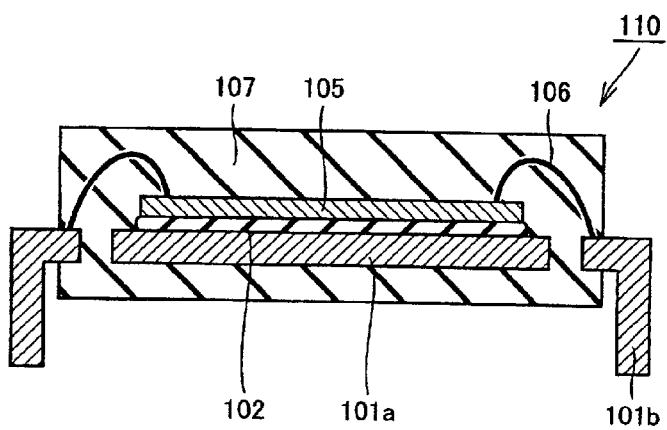
FIG. 12 is a cross-sectional view schematically showing a configuration of the conventional semiconductor device.

The configuration of the semiconductor device as shown in FIG. 10 differs from that of FIG. 2 in that a groove for fitting-in seal member 4 or a depressed portion is not provided on island portion 1a. Here, airtight space 8 corresponding to the thickness of seal member 4 is formed.

It is noted that the configurations shown in FIGS. 8–10 are the same with that of FIG. 2 except the above-described points, and therefore, the same components are denoted with the same reference characters and the description thereof will not be repeated.

Furthermore, though DIP (Dual Inline Package) has been described as semiconductor package 10 in the above first to third embodiments, the semiconductor device of the present invention is not limited thereto and any type of semiconductor device may be employed as long as a semiconductor chip is fixed on a substrate, for example, at an island portion. The semiconductor device of the present invention may be, for example, an in-line type package, an insertion mounting type package such as PGA (Pin Grid Array Package) other than the in-line type, a flat package type such as QFP (Quad Flat Package), or a surface mount type package such as chip carrier type, for example, BGA (Ball Grid Array).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

laying a semiconductor chip on a substrate in a temperature environment that is higher than a temperature at a resin sealing step to create a space kept airtight between said substrate and semiconductor chip; and fixing said semiconductor chip on said substrate by making negative an atmospheric pressure in said space relative to external atmospheric pressure with lowered ambient temperature, after laying said semiconductor chip on said substrate.

2. The method of manufacturing the semiconductor device according to claim 1, wherein the step of laying said semiconductor chip on said substrate and the step of fixing said semiconductor chip on said substrate with lowered ambient temperature are performed in a nitrogen gas atmosphere.

3. The method of manufacturing the semiconductor device according to claim 1, wherein the step of laying said semiconductor chip on said substrate and the step of fixing the semiconductor chip on said substrate with lowered ambient temperature are performed in an inert gas atmosphere.

4. The method of manufacturing the semiconductor device according to claim 1, wherein the step of laying said semiconductor chip on said substrate and the step of fixing said semiconductor chip on said substrate with lowered ambient temperature are performed in a 1 atm pressure environment.

5. The method of manufacturing the semiconductor device according to claim 4, wherein said 1 atm pressure environment is obtained in a high-temperature chamber of a structure having a portion open to the outside for maintaining internal pressure at 1 atm.

6. The method of manufacturing the semiconductor device according to claim 4, wherein said 1 atm pressure environment is obtained in a high-temperature chamber having such a structure that allows variation in its capacity to maintain internal pressure at 1 atm.

* * * * *